US012740190B2

(12) United States Patent
Zheng et al.

(10) Patent No.: US 12,740,190 B2
(45) Date of Patent: Sep. 15, 2026

(54) SEMICONDUCTOR LIGHT EMITTING ELEMENT AND MANUFACTURE METHOD THEREOF

(71) Applicant: XIAMEN SILAN ADVANCED COMPOUND SEMICONDUCTOR CO., LTD., Xiamen (CN)

(72) Inventors: Jinjian Zheng, Xiamen (CN); Moran Gao, Xiamen (CN); Jingfeng Bi, Xiamen (CN); Weihong Fan, Xiamen (CN); Senlin Li, Xiamen (CN); Jiaming Zeng, Xiamen (CN); Yuanjie Wu, Xiamen (CN); Chengjun Zhang, Xiamen (CN)

(73) Assignee: XIAMEN SILAN ADVANCED COMPOUND SEMICONDUCTOR CO., LTD., Xiamen (CN)

( * ) Notice: Subject to any disclaimer, the term of this patent is extended or adjusted under 35 U.S.C. 154(b) by 408 days.

(21) Appl. No.: 18/554,858

(22) PCT Filed: Mar. 1, 2022

(86) PCT No.: PCT/CN2022/078636
§ 371 (c)(1),
(2) Date: Oct. 11, 2023

(87) PCT Pub. No.: WO2022/252721
PCT Pub. Date: Dec. 8, 2022

(65) Prior Publication Data

US 2024/0204134 A1 Jun. 20, 2024

(30) Foreign Application Priority Data

Jun. 4, 2021 (CN) ......................... 202110625873.1

(51) Int. Cl.
*H01L 33/14* (2010.01)
*H10H 20/01* (2025.01)
(Continued)

(52) U.S. Cl.
CPC .... *H10H 20/816* (2025.01); *H10H 20/01335* (2025.01); *H10H 20/812* (2025.01); *H10H 20/825* (2025.01)

(58) Field of Classification Search
CPC ............... H10H 20/816; H10H 20/825; H10H 20/01335; H10H 20/812
See application file for complete search history.

(56) References Cited

U.S. PATENT DOCUMENTS

2015/0243845 A1 8/2015 Chen et al.
2017/0110626 A1 4/2017 Jorgenson

FOREIGN PATENT DOCUMENTS

CN 1921157 A 2/2007
CN 103681996 A * 3/2014 ........... H10H 20/816
(Continued)

OTHER PUBLICATIONS

International Search Report with English translation and Written Opinion for International Application No. PCT/CN2022/078636, date of mailing May 19, 2022, 13 pages.
(Continued)

*Primary Examiner* — William C Trapanese
(74) *Attorney, Agent, or Firm* — Westman, Champlin & Koehler, P.A.

(57) ABSTRACT

A semiconductor light emitting element and a manufacture method thereof are provided. The semiconductor light emitting element includes: a substrate, an n-type semiconductor layer, a quantum well layer and a p-type semiconductor layer being arranged sequentially from bottom to top, and further includes a surface plasmon excition layer being arranged on the p-type semiconductor layer and a surface plasmon excited layer being arranged between the quantum well layer and the p-type semiconductor layer, or the surface plasmon excitation layer being arranged between the p-type semiconductor layer and the surface plasmon excitation layer, or the surface plasmon excitation layers being arranged respectively between the quantum well layer and the p-type semiconductor layer and between the p-type semiconductor layer and the surface plasmon excitation layer. The quantum efficiency of the semiconductor light emitting element is improved, the light emitting uniformity and the anti-ESD capability of the semiconductor light emitting element are enhanced.

32 Claims, 3 Drawing Sheets

(51) Int. Cl.

| | |
|---|---|
| ***H10H 20/812*** | (2025.01) |
| ***H10H 20/816*** | (2025.01) |
| ***H10H 20/825*** | (2025.01) |

(56) References Cited

FOREIGN PATENT DOCUMENTS

| | | | |
|---|---|---|---|
| CN | 103840056 | A | 6/2014 |
| CN | 106711294 | A | 5/2017 |
| CN | 113328018 | A | 8/2021 |
| CN | 113410348 | A | 9/2021 |
| CN | 115394892 | A | 11/2022 |

OTHER PUBLICATIONS

First Office Action, including Search Report, for Chinese Patent Application No. 202110625873.1, dated Feb. 16, 2022, 23 pages.

* cited by examiner

SEMICONDUCTOR LIGHT EMITTING ELEMENT AND MANUFACTURE METHOD THEREOF

CROSS-REFERENCE TO RELATED APPLICATION

This application is a Section 371 National Stage application of International application NO. PCT/CN2022/078636, which was filed on Mar. 1, 2022, and published as WO/2022/252721 on Dec. 8, 2022, which claims priority to the Chinese Patent Application No. 202110625873.1, filed on Jun. 4, 2021, entitled "semiconductor light emitting element and manufacture method thereof", and published as CN113328018A on Aug. 31, 2021, the contents of which are incorporated herein by reference in their entireties.

FIELD OF THE DISCLOSURE

The present disclosure relates to the field of semiconductor photoelectric devices, and in particular, to a semiconductor light emitting element and a manufacture method thereof.

DESCRIPTION OF THE RELATED ART

Nitride semiconductor is third-generation compound semiconductor, and a light emitting element made of the nitride semiconductor has become a mainstream illumination light source in a market due to advantages of energy conservation and environmental protection, high luminous efficiency, easy control of color and wavelength, small volume, long service life and the like. Since the nitride semiconductor has an adjustable wavelength which is capable of covering yellow, green, blue, violet, and deep ultraviolet bands, it is widely used in various fields such as laser display, Mini-LED (submillimeter Light Emitting Diode) backlight, Micro-LED (Micro Light Emitting Diode) backlight, home lighting, outdoor street lighting, stage lighting, traffic lights, TV backlight, mobile phone and computer backlight, indoor displays, lamps, plant lighting, medical treatment, curing, sterilization, and disinfection. Currently, those skilled in art are mainly concerned about performance improvements of LEDs (Light Emitting Diodes) in terms of brightness enhancement, ESD (Electro-Static discharge), aging and etc. But there are only few research and application of surface plasmon effect in the light emitting diode.

Therefore, it is necessary to study the surface plasmon effect in the light emitting diode to improve the performance of the light emitting diode.

SUMMARY OF THE DISCLOSURE

The present disclosure aims to provide a semiconductor light emitting element and a manufacture method thereof, which utilize surface plasmon effect to improve a transverse spreading capability and longitudinal injection efficiency of holes, and further improve quantum efficiency, light emitting uniformity and an anti-ESD capability of the semiconductor light emitting element.

In order to achieve above and other related objects, the present disclosure provides a semiconductor light emitting element, including: a substrate, an n-type semiconductor layer, a quantum well layer, and a p-type semiconductor layer, which are arranged from bottom to top, wherein the semiconductor light emitting element further includes a surface plasmon excited layer and a surface plasmon excitation layer, wherein the surface plasmon excitation layer is arranged on the p-type semiconductor layer, the surface plasmon excited layer is arranged between the quantum well layer and the p-type semiconductor layer, or the surface plasmon excited layer is arranged between the p-type semiconductor layer and the surface plasmon excitation layer, or the surface plasmon excited layers are respectively arranged between the quantum well layer and the p-type semiconductor layer and between the p-type semiconductor layer and the surface plasmon excitation layer.

Optionally, in the semiconductor light emitting element, a two-dimensional hole gas is formed in the surface plasmon excited layer, and a carrier concentration of the two-dimensional hole gas is 1E16 $cm^{-3}$ to 1E19 $cm^{-3}$.

Optionally, in the semiconductor light emitting element, the surface plasmon excited layer includes a superlattice structure $(A/B)_n$, wherein n is a period number of the superlattice structure, structure A and structure B are at least one of GaN, InGaN, AlGaN, AlInGaN, AlN and AlInN respectively, and the structure A and the structure B are different.

Optionally, in the semiconductor light emitting element, the period number n of the superlattice structure ranges from 5 to 30.

Optionally, in the semiconductor light emitting element, a thickness of the structure A of each periodic structure in the superlattice structure is 5 nm≥A≥0.3 nm, and a thickness of the structure B of each periodic structure in the superlattice structure is 5 nm≥B≥0.3 nm.

Optionally, in the semiconductor light emitting element, the carrier concentration of the two-dimensional hole gas is adjusted by controlling the period number of the superlattice structure and a difference in composition ratio between the structure A and the structure B.

Optionally, in the semiconductor light emitting element, the surface plasmon excited layer has a structure of any one or more of a plurality of structures selected from a group consisting of a superlattice structure composed of GaN and AlN, a superlattice structure composed of GaN and AlGaN, a superlattice structure composed of GaN and AlInN, a superlattice structure composed of GaN and AlInGaN, a superlattice structure composed of InGaN and AlGaN, a superlattice structure composed of InGaN and AlInN, a superlattice structure composed of InGaN and AlInGaN, a superlattice structure composed of AlGaN and AlInN, and a superlattice structure composed of AlGaN and AlInGaN.

Optionally, in the semiconductor light emitting element, a thickness of the surface plasmon excitation layer ranges from 10 nm to 50 nm.

Optionally, in the semiconductor light emitting element, the surface plasmon excitation layer includes a metal material.

Optionally, in the semiconductor light emitting element, the metal material includes any one or more of a metal thin film, metal nanoparticles, and metal quantum dots.

Optionally, in the semiconductor light emitting element, the metal material of the surface plasmon excitation layer includes any one or more of an Ag mirror, an Al mirror, Ag nanoparticles, Al nanoparticles, Au nanoparticles, Ag quantum dots, and Al quantum dots.

Optionally, in the semiconductor light emitting element, in a case that the surface plasmon excited layer is arranged between the p-type semiconductor layer and the surface plasmon excitation layer, an isolation layer is further interposed between the surface plasmon excited layer and the surface plasmon excitation layer.

Optionally, in the semiconductor light emitting element, a material of the isolation layer includes any one or more of GaN, InGaN, AlGaN, and AlInGaN.

Optionally, in the semiconductor light emitting element, in a case that the surface plasmon excited layer is arranged between the quantum well layer and the p-type semiconductor layer, a metal layer is further interposed between the p-type semiconductor layer and the surface plasmon excitation layer.

Optionally, in the semiconductor light emitting element, a material of the metal layer includes Ti.

Optionally, in the semiconductor light emitting element, a thickness of the p-type semiconductor layer is 40 nm to 100 nm.

In order to achieve above and other related objects, the present disclosure further provides a manufacture method of a semiconductor light emitting element, including:

providing a substrate;

forming an n-type semiconductor layer on the substrate;

forming a quantum well layer on the n-type semiconductor layer;

forming a p-type semiconductor layer on the quantum well layer;

wherein the manufacture method further includes forming a surface plasmon excitation layer on the p-type semiconductor layer; and forming a surface plasmon excited layer between the quantum well layer and the p-type semiconductor layer, or forming the surface plasmon excited layer between the p-type semiconductor layer and the surface plasmon excitation layer, or forming the surface plasmon excited layers between the quantum well layer and the p-type semiconductor layer and between the p-type semiconductor layer and the surface plasmon excitation layer respectively.

Optionally, in the manufacture method of the semiconductor light emitting element, a two-dimensional hole gas is formed in the surface plasmon excited layer, and a carrier concentration of the two-dimensional hole gas is 1E16 $cm^{-3}$ to 1E19 $cm^{-3}$.

Optionally, in the manufacture method of the semiconductor light emitting element, the surface plasmon excited layer includes a superlattice structure $(A/B)_n$, wherein n is a period number of the superlattice structure, structure A and structure B are at least one of GaN, InGaN, AlGaN, AlInGaN, AlN and AlInN respectively, and the structure A and the structure B are different.

Optionally, in the manufacture method of the semiconductor light emitting element, the period number n of the superlattice structure ranges from 5 to 30.

Optionally, in the manufacture method of the semiconductor light emitting element, a thickness of the structure A of each periodic structure in the superlattice structure is 5 nm≥A≥0.3 nm, and a thickness of the structure B of each periodic structure in the superlattice structure is 5 nm≥B≥0.3 nm.

Optionally, in the manufacture method of the semiconductor light emitting element, the carrier concentration of the two-dimensional hole gas is adjusted by controlling the period number of the superlattice structure and a difference in composition ratio between the structure A and the structure B.

Optionally, in the manufacture method of the semiconductor light emitting element, the surface plasmon excited layer has a structure of any one or more of a plurality of structures selected from a group consisting of a superlattice structure composed of GaN and AlN, a superlattice structure composed of GaN and AlGaN, a superlattice structure composed of GaN and AlInN, a superlattice structure composed of GaN and AlInGaN, a superlattice structure composed of InGaN and AlGaN, a superlattice structure composed of InGaN and AlInN, a superlattice structure composed of InGaN and AlInGaN, a superlattice structure composed of AlGaN and AlInN, and a superlattice structure composed of AlGaN and AlInGaN.

Optionally, in the manufacture method of the semiconductor light emitting element, a thickness of the surface plasmon excitation layer ranges from 10 nm to 50 nm.

Optionally, in the manufacture method of the semiconductor light emitting element, the surface plasmon excitation layer includes a metal material.

Optionally, in the manufacture method of the semiconductor light emitting element, the metal material includes any one or more of a metal thin film, metal nanoparticles, and metal quantum dots.

Optionally, in the manufacture method of the semiconductor light emitting element, the metal material of the surface plasmon excitation layer includes any one or more of an Ag mirror, an Al mirror, Ag nanoparticles, Al nanoparticles, Au nanoparticles, Ag quantum dots, and Al quantum dots.

Optionally, in the manufacture method of the semiconductor light emitting element, in a case that the surface plasmon excited layer is arranged between the p-type semiconductor layer and the surface plasmon excitation layer, an isolation layer is further formed between the surface plasmon excited layer and the surface plasmon excitation layer.

Optionally, in the manufacture method of the semiconductor light emitting element, a material of the isolation layer includes any one or more of GaN, InGaN, AlGaN, and AlInGaN.

Optionally, in the manufacture method of the semiconductor light emitting element, in a case that the surface plasmon excited layer is arranged between the quantum well layer and the p-type semiconductor layer, a metal layer is further formed between the p-type semiconductor layer and the surface plasmon excitation layer.

Optionally, in the manufacture method of the semiconductor light emitting element, a material of the metal layer includes Ti.

Optionally, in the manufacture method of the semiconductor light emitting element, a thickness of the p-type semiconductor layer is 40 nm to 100 nm.

Compared with the prior art, a technical scheme of the present disclosure has following beneficial effects:

the semiconductor light emitting element and the manufacture method thereof provided in the present disclosure inducing and enhancing a longitudinal hole injection efficiency and a transverse hole diffusion capability of the two-dimensional hole gas of the surface plasmon excited layer by use of the surface plasmon excitation layer, improving mobility and distribution probability of the holes, and improving quantum efficiency of the semiconductor light emitting element; meanwhile, the surface plasmon excitation layer induces and enhances the two-dimensional hole gas of the surface plasmon excited layer to form transverse spreading and transporting, so that a hole diffusion capability is improved, and a light emitting uniformity and an anti-ESD capability of the semiconductor light emitting element are enhanced.

BRIEF DESCRIPTION OF THE DRAWINGS

in FIGS. 1-4,

100—substrate, 101—n-type semiconductor layer, 102—quantum well layer, 103—p-type semiconductor layer, 104—surface plasmon excited layer, 105—surface plasmon excitation layer.

DETAILED DESCRIPTION OF THE PRESENT DISCLOSURE

Currently, those skilled in the art are mainly concerned about performance improvements of LEDs (Light Emitting Diodes) in terms of brightness enhancement, ESD (Electro-Static discharge), aging and etc. But there are few research and application of surface plasmon effect in the light emitting diode.

Therefore, it is necessary to study the surface plasmon effect in the light emitting diode to improve the performance of the light emitting diode.

The present disclosure provides a semiconductor light emitting element, which improves the transverse spreading capability and longitudinal injection efficiency of holes by use of the surface plasmon effect, and further improves the quantum efficiency, the light emitting uniformity and the anti-ESD capability of the semiconductor light emitting element.

The semiconductor light emitting element and the manufacture method of the same according to the present disclosure will be described in further detail with reference to the accompanying drawings and specific examples. The advantages and features of the present disclosure will become more apparent from the following description. It is to be noted that the drawings are in a very simplified form and are not to precise scale, which is merely for the purpose of facilitating and distinctly claiming the embodiments of the present disclosure.

Figure 1:
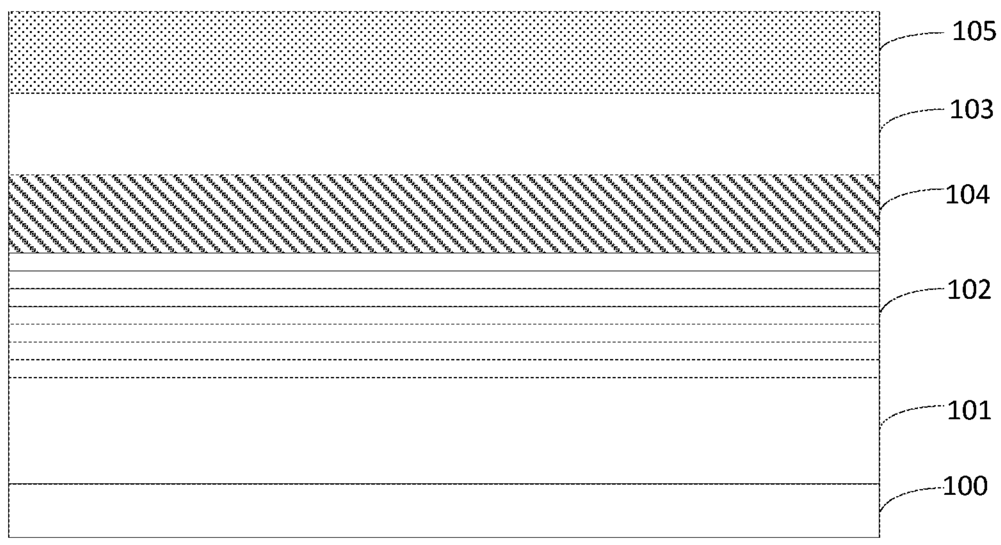
FIG. 1 is a schematic structural diagram of a semiconductor light emitting element according to an embodiment of the present disclosure.
Figure 2:
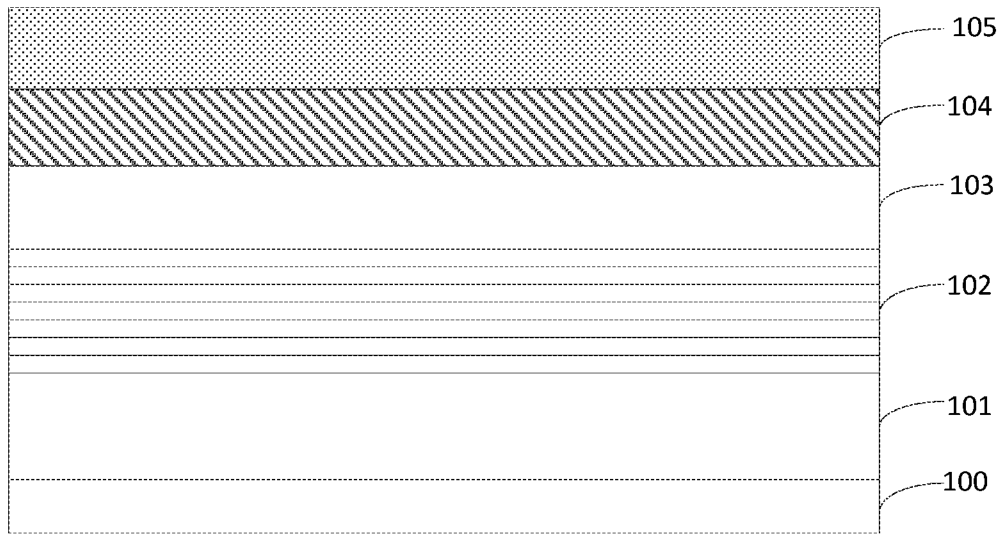
FIG. 2 is a schematic structural diagram of another semiconductor light emitting element according to an embodiment of the present disclosure.

Referring to FIGS. 1 and 2, the semiconductor light emitting element provided by the present disclosure includes a substrate 100, an n-type semiconductor layer 101, a quantum well layer 102, and a p-type semiconductor layer 103 which are arranged sequentially from bottom to top, and the semiconductor light emitting element further includes a surface plasmon excitation layer 105 arranged on the p-type semiconductor layer 103, and a surface plasmon excited layer 104 arranged between the quantum well layer 102 and the p-type semiconductor layer 103, or the surface plasmon excited layer 104 arranged between the p-type semiconductor layer 103 and the surface plasmon excitation layer 105, or the surface plasmon excited layers 104 arranged respectively between the quantum well layer 102 and the p-type semiconductor layer 103 and between the p-type semiconductor layer 103 and the surface plasmon excitation layer 104.

For example, a substrate consisting of any one of sapphire, GaN, SiC, Si, Ge, or ZnO, etc., may be served as the substrate 100, but the present disclosure is not limited thereto. A thickness of the substrate 100 is not specifically limited. A substrate pattern may be formed on an upper surface of the substrate 100, and the substrate pattern may have a concave-convex shape with a convex part and a concave part. Shapes of the convex part and the concave part are not specifically limited, and an arrangement of the convex part and the concave part on the upper surface is not specifically limited. For example, the convex part may be optionally provided at positions on the upper surface which form vertices of a substantially equilateral triangle.

An n-type semiconductor layer 101 is grown on the substrate 100, wherein the n-type semiconductor layer 101 is a layer made of a nitride material doped with an n-type doping element and mainly used for providing electrons. For example, the n-type semiconductor layer 101 is a GaN (gallium nitride) layer doped with Si. The n-type semiconductor layer is of a conventional structure and is not described in detail herein.

A buffer layer may be further formed between the substrate 100 and the n-type semiconductor layer 101, wherein the buffer layer is used to reduce lattice mismatch between the substrate and the epitaxial layer, so as to reduce a possibility of defects and dislocations occurring in the grown epitaxial layer, and improve crystal quality. The buffer layer is not limited to one material, and may be a plurality of materials, combinations of different dopants and different doping concentrations, etc., and all materials of the buffer layer disclosed so far are within the protection scope of the present disclosure. Optionally, the buffer layer is made of nitride, for example, the buffer layer may be a GaN layer or an AlON layer. When the buffer layer is an AlON layer, a very small portion (0.5% to 2%) of N(nitrogen) in the AlON layer constituting the buffer layer is optionally replaced with oxygen. In this case, since the buffer layer grows in a direction of a normal line of a growth surface of the substrate 100, the buffer layer composed of an aggregate of columnar crystals having uniform crystal grains may be obtained. The AlON layer is optionally formed by a known sputtering method. When the buffer layer is a GaN layer, the GaN layer may be formed by metal organic chemical vapor deposition (MOCVD) at a low temperature (e.g., 500° C.). Of course, a nucleation layer, a stress release layer, and the like may be further included between the substrate 100 and the n-type semiconductor layer 101, which is not described in detail herein.

A quantum well layer 102 is grown on the n-type semiconductor layer 101, wherein the quantum well layer 102 includes a well layer and a barrier layer. The quantum well layer 102 may be a single quantum well structure or a multiple quantum well structure. The quantum well layer 102 is optionally the multiple quantum well structure, for example, a periodic structure composed of InGaN and AlGaN, wherein the well layer is InGaN, the barrier layer is AlGaN, the period number is k, and $k \geq 1$.

In the quantum well layer 102, bandgap energy of the well layer may be changed by changing an In composition of the well layer. Optionally, thicknesses of the well layers are the same as each other. In the quantum well layer 102, if the thicknesses of the well layers are the same as each other, quantum energy levels of the well layers are the same, so that wavelengths of light generated due to recombination of electrons and holes in the well layers are the same. Thereby, width of peak exhibited by an emission spectrum of the semiconductor light emitting element becomes narrow.

A p-type semiconductor layer 103 is formed on the quantum well layer 102, wherein the p-type semiconductor layer 103 is a layer made of a nitride material doped with a p-type doping element and mainly used for providing holes. For example, the p-type semiconductor layer 103 is a GaN (gallium nitride) layer doped with Mg or Zn or the like. In the present embodiment, when the surface plasmon excited layer 104 is located between the quantum well layer 102 and the p-type semiconductor layer 103, and the surface plasmon excitation layer 105 is located on the p-type semiconductor layer 103, that is, when the surface plasmon excited layer 104 and the surface plasmon excitation layer 105 are respectively located on two sides of the p-type semiconductor layer 103, a thickness of the p-type semiconductor layer 103 may also be configured to adjust a coupling distance between the surface plasmon excited layer 104 and the surface plasmon excitation layer 105, that is, to adjust an ability that the surface plasmon excitation layer 105 induces and enhances a two-dimensional hole gas of the surface plasmon excited layer 104. Therefore, the thickness of the p-type semiconductor layer 103 needs to be limited, and the thickness of the p-type semiconductor layer 103 is optionally 40 nm to 100 nm. In a case that the thickness of the p-type semiconductor layer 103 is too thin, the number of holes provided is reduced, so as to affect the performance of the semiconductor light emitting element: in a case that the thickness of the p-type semiconductor layer 103 is too thick, a coupling effect is reduced.

The surface plasmon excitation layer 105 is formed on the p-type semiconductor layer 103, wherein the surface plasmon excitation layer 105 includes a metal material, which cannot be an insulating material such as $SiO_2$, $SiN_x$ or DBR, etc. The metal material may include any one or more of metal films, metal nano particles and metal quantum dots. Further, the metal may be any one or more of Ag mirror, Al mirror, Ag nanoparticles, Al nanoparticles, Au nanoparticles, Ag quantum dots, and Al quantum dots, but is not limited thereto. A thickness of surface plasmon excitation layer 105 is optionally 10 nm to 50 nm.

The surface plasmon excitation layer 105 is located above the p-type semiconductor layer 103, and may increase a luminous intensity of the multiple quantum well structure by increasing an angle of an escape cone and a reflectively of light. For example, in a flip-chip LED structure, when the metal material of surface plasmon excitation layer 105 is an Ag mirror, on one hand, since the refractive index of Ag is greater than that of air, the angle of the light escape cone becomes large; on the other hand, the Ag mirror may serve as a reflector to enhance the reflection of light, both of which result in an increase of the luminous intensity of the multiple quantum well structure.

The surface plasmon excitation layer 105 includes the metal material, so as to form a surface plasmon at an interface of the surface plasmon excitation layer 105. Valence electrons existing on a metal surface cause collective excitation of an electronic system due to a long-range Coulomb effect, and their density fluctuations form a collective oscillation of positive ions and negative ions relative to a positive charge background of an atomic nucleus, which is called surface plasmon. The surface plasmon excitation layer 105 may also couple with electron-hole pairs in the quantum well layer 102, so as to improve a spontaneous emission efficiency of the electron-hole pairs in the quantum well layer 102, and further improve luminous efficiency.

The semiconductor light emitting element further includes the surface plasmon excited layer 104, wherein the surface plasmon excited layer 104 is located between the quantum well layer 102 and the p-type semiconductor layer 103, or between the p-type semiconductor layer 103 and the surface plasmon excitation layer 105.

A structure of the surface plasmon excited layer 104 is optionally a superlattice structure $(A/B)_n$, wherein n is a period number of the superlattice structure and ranges from 5 to 30, the structure A and the structure B are at least one of GaN, InGaN, AlGaN, AlInGaN, AlN and AlInN respectively, but not limited to thereto, and the structure A and the structure B are different. For example, the structure of the surface plasmon excited layer 104 is any one or more of a superlattice structure composed of GaN and AlN, a superlattice structure composed of GaN and AlGaN, a superlattice structure composed of GaN and AlInN, a superlattice structure composed of GaN and AlInGaN, a superlattice structure composed of InGaN and AlGaN, and a superlattice structure composed of InGaN and AlInN, a superlattice structure composed of InGaN and AlInGaN, a superlattice structure composed of AlGaN and AlInN and a superlattice structure composed of AlGaN and AlInGaN, but not limited thereto. A thickness of the structure A of each periodic structure in the superlattice structure of the surface plasmon excitation 104 is 5 nm≥A≥0.3 nm, and a thickness of the structure B of each periodic structure in the superlattice structure is 5 nm≥B≥0.3 nm.

Since the structure A and the structure B in the surface plasmon excited layer 104 have different lattice constants, that is, the surface plasmon excited layer 104 is a superlattice structure having different lattice constants. Therefore, polarized holes may be excited at the interface between the structure A and the structure B, and the two-dimensional hole gas is generated. A concentration of the two-dimensional hole gas may be adjusted by controlling the period number of the superlattice structure and a difference in composition ratio between the structure A and the structure B. A carrier concentration of the two-dimensional hole gas is optionally 1E16 $cm^{-3}$ to 1E19 $cm^{-3}$.

Surface plasmon effect is formed by free electrons of the surface plasmon excitation layer 105 and the two-dimensional hole gas generated by the surface plasmon excited layer 104. Since two sub-layers (the structure A and the structure B) in the superlattice structure of the surface plasmon excited layer 104 have different structure and different lattice constant, after the semiconductor light emitting element is electrified, polarized holes may be generated at an interface of the two sub-layers, the holes may tunnel through the p-type semiconductor layer 103, surface plasmon resonance phenomenon is formed by the holes and free electrons at a metal interface of the surface plasmon excitation layer 105, transporting and diffusion of the holes are promoted, that is, the surface plasmon excitation layer 105 may induce and enhance the longitudinal hole injection efficiency and the transverse hole diffusion capacity of the two-dimensional hole gas of the surface plasmon excited layer, and the light emitting uniformity is improved due to the fact that the diffusion capacity of the holes is improved. The existence of the superlattice structure improves the current spreading capability, and the increase of the thickness of the superlattice structure further enhances the current spreading, a local current density is improved, a probability of local breakdown is reduced, and the anti-ESD capability is further improved.

Referring to FIG. 1, when the surface plasmon excited layer 104 is disposed between the quantum well layer 102 and the p-type semiconductor layer 103, and surface plasmon excitation layer 105 is disposed on the p-type semiconductor layer 103, adhesion between the p-type semiconductor layer 103 and the surface plasmon excitation layer 105 is poor, and therefore, a metal layer (not shown) is further interposed between the p-type semiconductor layer 103 and the surface plasmon excitation layer 105 to increase adhesion between the p-type semiconductor layer 103 and the surface plasmon excitation layer 105. A material of the metal layer includes, but is not limited to, Ti, etc.

In the present embodiment, the surface plasmon excited layer 104 may also serve as an electron barrier layer to prevent electrons from overflowing, so that more electrons and holes recombination for light emission in the quantum well layer 102, and the luminous efficiency is further improved.

Referring to FIG. 2, when the surface plasmon excited layer 104 is disposed between the p-type semiconductor layer 103 and the surface plasmon excitation layer 105, an isolation layer (not shown) is further interposed between the surface plasmon excited layer 104 and the surface plasmon excitation layer 105 to increase ohmic contact performance between the surface plasmon excited layer 104 and the surface plasmon excitation layer 105. Meanwhile, the isolation layer may also be used to regulate a coupling distance between the plasmon excited layer 104 and surface plasmon excitation layer 105. Optionally, a thickness of the isolation layer is 10 nm to 50 nm. In a case that the thickness of the isolation layer is too thick, the coupling effect between the surface plasmon excited layer 104 and the surface plasmon excitation layer 105 is too weak: in a case that the thickness of the isolation layer is too thin, the ohmic contact performance between the surface plasmon excited layer 104 and the surface plasmon excitation layer 105 is affected. A material of the isolation layer includes any one or more of GaN, InGaN, AlGaN, and AlInGaN, but is not limited thereto, but any material capable of increasing the ohmic contact performance between the surface plasmon excited layer 104 and the surface plasmon excitation layer 105 is within the protection scope of the present embodiment.

The surface plasmon excited layer 104 may also be disposed as two layers, one layer being disposed between the p-type semiconductor layer 103 and the surface plasmon excitation layer 105, and the other layer being disposed between the quantum well layer 102 and the p-type semiconductor layer 103. Therefore, the surface plasmon excited layer 104 may serve as an electron barrier layer to prevent electrons from overflowing, and may be induced and enhanced the longitudinal hole injection efficiency and the transverse hole diffusion capability of the two-dimensional hole gas by the surface plasmon excitation layer 105.

According to the semiconductor light emitting element in the present disclosure, inducing and enhancing a longitudinal hole injection efficiency and a transverse hole diffusion capability of the two-dimensional hole gas of the surface plasmon excited layer by use of the surface plasmon excitation layer, improving mobility and distribution probability of the holes, and improving quantum efficiency of the semiconductor light emitting element: meanwhile, the surface plasmon excitation layer induces and enhances the two-dimensional hole gas of the surface plasmon excited layer to form transverse spreading and transporting, so that a hole diffusion capability is improved, and a light emitting uniformity and an anti-ESD capability of the semiconductor light emitting element are enhanced.

Different from the conventional method for improving the spontaneous radiation efficiency of electron-hole pairs in the quantum well layer by surface plasmon resonance coupling, the present disclosure uses a surface plasmon excitation layer to induce a two-dimensional hole gas in the surface plasmon excited layer, increases the hole injection efficiency of the two-dimensional hole gas, improves the mobility and the distribution probability of the holes, and improves the quantum efficiency of the semiconductor light emitting element.

In addition, the present disclosure further provides a manufacture method of the semiconductor light emitting element, which specifically includes the following steps:

providing a substrate;

forming an n-type semiconductor layer on the substrate;

forming a quantum well layer on the n-type semiconductor layer;

forming a p-type semiconductor layer on the quantum well layer;

wherein the manufacture method further includes forming a surface plasmon excitation layer and a surface plasmon excited layer, the surface plasmon excitation layer is formed on the p-type semiconductor layer: and the surface plasmon excited layer is formed between the quantum well layer and the p-type semiconductor layer, or the surface plasmon excited layer is formed between the p-type semiconductor layer and the surface plasmon excitation layer, or the surface plasmon excited layers are respectively formed between the quantum well layer and the p-type semiconductor layer and between the p-type semiconductor layer and the surface plasmon excitation layer.

Figure 3:
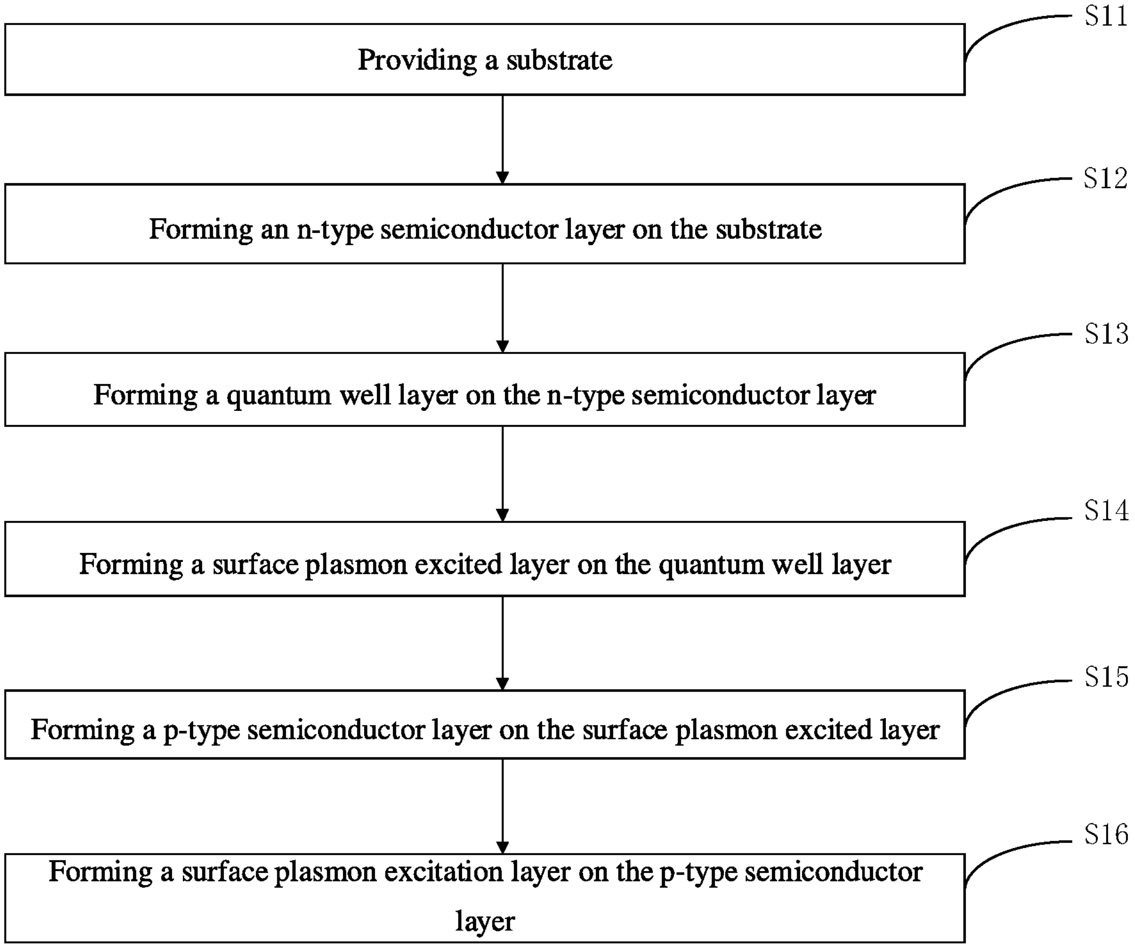
FIG. 3 is a flowchart of a manufacture method of the semiconductor light emitting element of FIG. 1.

Specifically, the manufacture method of the semiconductor light emitting element includes two kinds of processes, one of which is shown in FIG. 3, and specifically includes:

step S11: providing a substrate;

step S12: forming an n-type semiconductor layer on the substrate;

step S13: forming a quantum well layer on the n-type semiconductor layer;

step S14: forming a surface plasmon excited layer on the quantum well layer;

step S15: forming a p-type semiconductor layer on the surface plasmon excited layer;

step S16: forming a surface plasmon excitation layer on the p-type semiconductor layer.

In the semiconductor light emitting element manufactured by the above manufacture method, the surface plasmon excited layer and the surface plasmon excitation layer are respectively located on two sides of the p-type semiconductor layer. In the above manufacture process, step S16 may further include: forming a metal layer between the p-type semiconductor layer and the surface plasmon excitation layer. The metal layer is used to increase adhesion between the p-type semiconductor layer and the surface plasmon excitation layer. The material of the metal layer includes, but is not limited to, Ti, etc.

Step S12 may further include: forming a buffer layer between the substrate and the n-type semiconductor layer. The buffer layer is used to reduce lattice mismatch between the substrate and the epitaxial layer so as to reduce the possibility of defects and dislocation occurring in the grown epitaxial layer and improve crystal quality.

Figure 4:
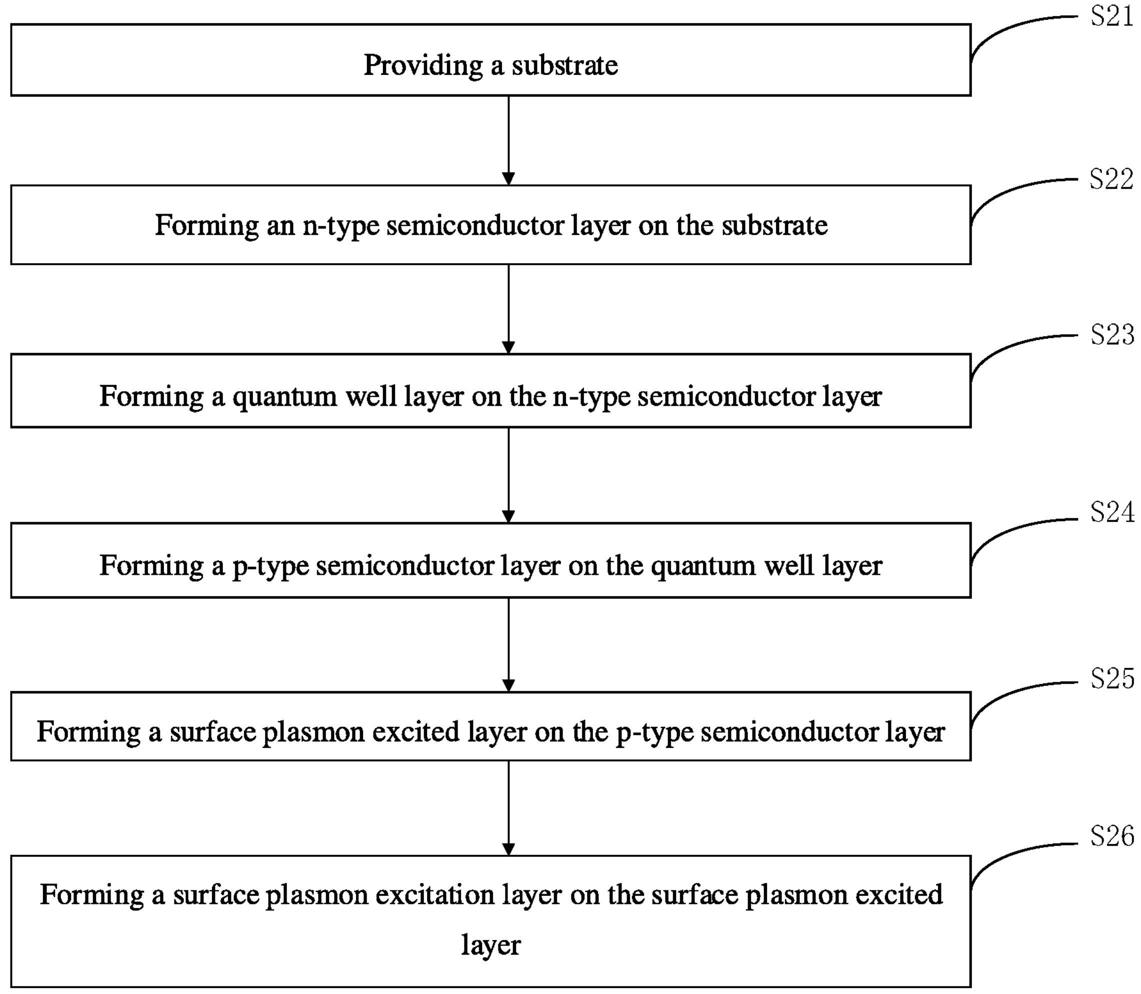
FIG. 4 is a flowchart of another manufacture method of the semiconductor light emitting element in FIG. 2.

Referring to FIG. 4, another process of the manufacture method of the semiconductor light emitting element is as follows:

step S21: providing a substrate;

step S22: forming an n-type semiconductor layer on the substrate;

step S23: forming a quantum well layer on the n-type semiconductor layer;

step S24: forming a p-type semiconductor layer on the quantum well layer;

step S25: forming a surface plasmon excited layer on the p-type semiconductor layer;

step S26: forming a surface plasmon excitation layer on the surface plasmon excited layer.

In the semiconductor light emitting element manufactured by the above manufacture method, both the surface plasmon excited layer and the surface plasmon excitation layer are located above the p-type semiconductor layer. In the above manufacture method, step S26 may further include: forming an isolation layer between the surface plasmon excited layer and the surface plasmon excitation layer. The isolation layer may increase ohmic contact performance between the surface plasmon excited layer and the surface plasmon excitation layer. Meanwhile, the isolation layer may also be used for regulating and controlling the coupling distance between the plasmon excited layer and the surface plasmon excitation layer. Optionally, the thickness of the isolation layer is 10 nm to 50 nm. In a case that the thickness of the isolation layer is too thick, the coupling effect between the surface plasmon excited layer and the surface plasmon excitation layer is too weak: in a case that the thickness of the isolation layer is too thin, ohmic contact performance between the surface plasmon excited layer and the surface plasmon excitation layer may be affected. The isolation layer is made of at least one of GaN, InGaN, AlGaN, and AlInGaN, but is not limited thereto.

Step S22 may further include: forming a buffer layer between the substrate and the n-type semiconductor layer. The buffer layer is used for reducing lattice mismatch between the substrate and the epitaxial layer so as to reduce the possibility of defects and dislocation occurring in the grown epitaxial layer and improve the crystal quality.

Step S24 may further include: forming a surface plasmon excited layer between the quantum well layer and the p-type semiconductor layer. In this case, the semiconductor light emitting element includes two surface plasmon excited layers, which are respectively located on two sides of the p-type semiconductor layer.

In the manufacture method of the semiconductor light emitting element, the process for forming the n-type semiconductor layer, the p-type semiconductor layer, the quantum well layer, the surface plasmon excited layer and the isolation layer may be any one of Metal Organic Chemical Vapor Deposition (MOCVD), molecular beam epitaxy, plasma-assisted chemical vapor deposition and laser sputtering, but is not limited thereto. For example, a Si-doped n-type semiconductor layer is formed on the substrate using an MOCVD process.

Forming process of the surface plasmon excitation layer and the metal layer may be at least one of an electron beam evaporation process, vacuum coating, and ion beam deposition, but is not limited thereto. The forming process of the surface plasmon excitation layer and the metal layer is optionally an electron beam evaporation process in this embodiment. For example, an Ag layer is prepared above a p-type semiconductor layer through an electron beam evaporation process, the thickness of the Ag layer is 10~50 nm, and due to poor adhesion between the Ag layer and the p-type semiconductor layer, an extremely thin metal layer such as a Ti layer may be plated to increase the adhesion.

According to the semiconductor light emitting element formed by the manufacture method of the semiconductor light emitting element, the surface plasmon excitation layer may induce and enhance the longitudinal hole injection efficiency and the transverse hole diffusion capability of the two-dimensional hole gas of the surface plasmon excited layer, so that the mobility and the distribution probability of holes are improved, and the quantum efficiency of the semiconductor light emitting element is improved: meanwhile, the surface plasmon excitation layer may induce and enhance two-dimensional hole gas of the surface plasmon excited layer to form transverse spreading and transporting, so that the hole diffusion capability is improved, and the light emitting uniformity and the anti-ESD capability of the semiconductor light emitting element are enhanced.

In addition, it is to be understood that while the present disclosure has been described in conjunction with the optional embodiments thereof, it is not intended to limit the present disclosure to those embodiments. It will be apparent to those skilled in the art from this disclosure that many changes and modifications may be made, or equivalents modified, in the embodiments of the present disclosure without departing from the scope of the present disclosure. Therefore, any simple modification, equivalent change and modification made to the above embodiments according to the technical essence of the present disclosure are still within the scope of the protection of the technical solution of the present disclosure, unless the contents of the technical solution of the present disclosure are departed.

It is to be further understood that the present disclosure is not limited to the particular methodology, compounds, materials, manufacturing techniques, uses, and applications described herein, which may, of course, vary. It is also to be understood that the terminology used herein is for the purpose of describing particular embodiments only, and is not intended to limit the scope of the present disclosure. It must be noted that, as used herein and in the appended claims, the singular forms "a," "an," and "the" include plural referents unless the context clearly dictates otherwise. Thus, for example, reference to "a step" or "an apparatus" means a reference to one or more steps or apparatuses and may include sub-steps as well as sub-apparatuses. All conjunctions used should be understood in the broadest sense. Thus, the word "or" should be understood to have the definition of a logical "or" rather than the definition of a logical "exclusive or" unless the context clearly dictates otherwise. Structures described herein are to be understood as also referring to functional equivalents of such structures. Language that may be construed as approximate should be understood as such unless the context clearly dictates otherwise.

What is claimed is:

1. A semiconductor light emitting element, comprising: a substrate, an n-type semiconductor layer, a quantum well layer, and a p-type semiconductor layer which are arranged sequentially from bottom to top, wherein the semiconductor light emitting element further comprises a surface plasmon excited layer and a surface plasmon excitation layer, wherein the surface plasmon excitation layer is arranged on the p-type semiconductor layer, the surface plasmon excited layer is arranged between the quantum well layer and the p-type semiconductor layer, or the surface plasmon excited layer is arranged between the p-type semiconductor layer and the surface plasmon excitation layer, or the surface plasmon excited layers are arranged respectively between the quantum well layer and the p-type semiconductor layer and between the p-type semiconductor layer and the surface plasmon excitation layer, wherein the surface plasmon excited layer comprises structure A and structure B with different lattice constants, and a two-dimensional hole gas is form in the surface plasmon excited layer.

2. The semiconductor light emitting element according to claim 1, wherein a carrier concentration of the two-dimensional hole gas is 1E16 $cm^{-3}$ to 1E19 $cm^{-3}$.

3. The semiconductor light emitting element according to claim 1, wherein the structure A and structure B forms a superlattice structure $(A/B)_n$, wherein n is a period number of the superlattice structure, the structure A and structure B are at least one of GaN, InGaN, AlGaN, AlInGaN, AlN and AlInN respectively, and the structure A and the structure B are different.

4. The semiconductor light emitting element according to claim 3, wherein the period number n of the superlattice structure ranges from 5 to 30.

5. The semiconductor light emitting element according to claim 3, wherein a thickness of the structure A of each periodic structure in the superlattice structure is 5 nm≥A≥0.3 nm, and a thickness of the structure B of each periodic structure in the superlattice structure is 5 nm≥B≥0.3 nm.

6. The semiconductor light emitting element according to claim 3, wherein a carrier concentration of the two-dimensional hole gas is adjusted by controlling the period number of the superlattice structure and a difference in composition ratio between the structure A and the structure B.

7. The semiconductor light emitting element according to claim 3, wherein the surface plasmon excited layer has a structure of any one or more of a plurality of structures selected from a group consisting of a superlattice structure composed of GaN and AlN, a superlattice structure composed of GaN and AlGaN, a superlattice structure composed of GaN and AlInN, a superlattice structure composed of GaN and AlInGaN, a superlattice structure composed of InGaN and AlGaN, a superlattice structure composed of InGaN and AlInN, a superlattice structure composed of InGaN and AlInGaN, a superlattice structure composed of AlGaN and AlInN, and a superlattice structure composed of AlGaN and AlInGaN.

8. The semiconductor light emitting element according to claim 1, wherein a thickness of the surface plasmon excitation layer ranges from 10 nm to 50 nm.

9. The semiconductor light emitting element according to claim 1, wherein the surface plasmon excitation layer comprises a metal material.

10. The semiconductor light emitting element according to claim 9, wherein the metal material comprises any one or more of a metal thin film, metal nanoparticles, and metal quantum dots.

11. The semiconductor light emitting element according to claim 10, wherein the metal material of the surface plasmon excitation layer comprises any one or more of an Ag mirror, an Al mirror, Ag nanoparticles, Al nanoparticles, Au nanoparticles, Ag quantum dots, and Al quantum dots.

12. The semiconductor light emitting element according to claim 1, wherein in a case that the surface plasmon excited layer is arranged between the p-type semiconductor layer and the surface plasmon excitation layer, an isolation layer is further interposed between the surface plasmon excited layer and the surface plasmon excitation layer.

13. The semiconductor light emitting element according to claim 12, wherein a material of the isolation layer comprises any one or more of GaN, InGaN, AlGaN, and AlInGaN.

14. The semiconductor light emitting element according to claim 1, wherein in a case that the surface plasmon excited layer is arranged between the quantum well layer and the p-type semiconductor layer, a metal layer is further interposed between the p-type semiconductor layer and the surface plasmon excitation layer.

15. The semiconductor light emitting element according to claim 14, wherein a material of the metal layer comprises Ti.

16. The semiconductor light emitting element according to claim 1, wherein a thickness of the p-type semiconductor layer is 40 nm to 100 nm.

17. A manufacture method of a semiconductor light emitting element, comprising:

providing a substrate;

forming an n-type semiconductor layer on the substrate;

forming a quantum well layer on the n-type semiconductor layer;

forming a p-type semiconductor layer on the quantum well layer;

wherein the manufacture method further comprises forming a surface plasmon excitation layer on the p-type semiconductor layer; and forming a surface plasmon excited layer between the quantum well layer and the p-type semiconductor layer, or forming the surface plasmon excited layer between the p-type semiconductor layer and the surface plasmon excitation layer, or forming the surface plasmon excited layers between the quantum well layer and the p-type semiconductor layer and between the p-type semiconductor layer and the surface plasmon excitation layer respectively, wherein the surface plasmon excited layer comprises structure A and structure B with different lattice constants, a two-dimensional hole gas is form in the surface plasmon excited layer.

18. The manufacture method of a semiconductor light emitting element according to claim 17, wherein a carrier concentration of the two-dimensional hole gas is 1E16 $cm^{-3}$ to 1E19 $cm^{-3}$.

19. The manufacture method of a semiconductor light emitting element according to claim 17, wherein the structure A and structure B forms a superlattice structure $(A/B)_n$, wherein n is a period number of the superlattice structure, structure A and structure B are at least one of GaN, InGaN, AlGaN, AlInGaN, AlN and AlInN respectively, and the structure A and the structure B are different.

20. The manufacture method of a semiconductor light emitting element according to claim 19, wherein the period number n of the superlattice structure ranges from 5 to 30.

21. The manufacture method of a semiconductor light emitting element according to claim 19, wherein a thickness of the structure A of each periodic structure in the superlattice structure is 5 nm≥A≥0.3 nm, and a thickness of the structure B of each periodic structure in the superlattice structure is 5 nm≥B≥0.3 nm.

22. The manufacture method of a semiconductor light emitting element according to claim 19, wherein a carrier concentration of the two-dimensional hole gas is adjusted by controlling the period number of the superlattice structure and a difference in composition ratio between the structure A and the structure B.

23. The manufacture method of a semiconductor light emitting element according to claim 19, wherein the surface plasmon excited layer has a structure of any one or more of a plurality of structures selected from a group consisting of a superlattice structure composed of GaN and AlN, a superlattice structure composed of GaN and AlGaN, a superlattice structure composed of GaN and AlInN, a superlattice structure composed of GaN and AlInGaN, a superlattice structure composed of InGaN and AlGaN, a superlattice structure composed of InGaN and AlInN, a superlattice structure composed of InGaN and AlInGaN, a superlattice structure composed of AlGaN and AlInN, and a superlattice structure composed of AlGaN and AlInGaN.

24. The manufacture method of a semiconductor light emitting element according to claim 17, wherein a thickness of the surface plasmon excitation layer ranges from 10 nm to 50 nm.

25. The manufacture method of a semiconductor light emitting element according to claim 17, wherein the surface plasmon excitation layer comprises a metal material.

26. The manufacture method of a semiconductor light emitting element according to claim 25, wherein the metal material comprises any one or more of a metal thin film, metal nanoparticles, and metal quantum dots.

27. The manufacture method of a semiconductor light emitting element according to claim 26, wherein the metal material of the surface plasmon excitation layer comprises any one or more of an Ag mirror, an Al mirror, Ag nanoparticles, Al nanoparticles, Au nanoparticles, Ag quantum dots, and Al quantum dots.

28. The manufacture method of a semiconductor light emitting element according to claim 17, wherein in a case that the surface plasmon excited layer is arranged between the p-type semiconductor layer and the surface plasmon excitation layer, an isolation layer is further formed between the surface plasmon excited layer and the surface plasmon excitation layer.

29. The manufacture method of a semiconductor light emitting element according to claim 28, wherein a material of the isolation layer comprises any one or more of GaN, InGaN, AlGaN, and AlInGaN.

30. The manufacture method of a semiconductor light emitting element according to claim 17, wherein in a case that the surface plasmon excited layer is arranged between the quantum well layer and the p-type semiconductor layer, a metal layer is further formed between the p-type semiconductor layer and the surface plasmon excitation layer.

31. The manufacture method of a semiconductor light emitting element according to claim 30, wherein a material of the metal layer comprises Ti.

32. The manufacture method of a semiconductor light emitting element according to claim 17, wherein a thickness of the p-type semiconductor layer is 40 nm to 100 nm.

* * * * *